United States Patent
Shin et al.

(12)

(10) Patent No.: US 6,182,376 B1
(45) Date of Patent: Feb. 6, 2001

(54) DEGASSING METHOD AND APPARATUS

(75) Inventors: Ho Seon Shin, Cupertino; Dan Marohl, San Jose, both of CA (US)

(73) Assignee: Applied Materials, Inc., Santa Clara, CA (US)

( * ) Notice: Under 35 U.S.C. 154(b), the term of this patent shall be extended for 0 days.

(21) Appl. No.: 08/891,048

(22) Filed: Jul. 10, 1997

(51) Int. Cl.[7] ...................................................... F26B 7/00
(52) U.S. Cl. .................................. 34/418; 34/92; 34/412
(58) Field of Search .............................. 34/92, 187, 289, 34/290, 403, 412, 418; 219/121.43, 121.58; 204/192.1, 298.35; 156/345

(56) References Cited

U.S. PATENT DOCUMENTS

| | | | |
|---|---|---|---|
| 4,816,638 | * 3/1989 | Ukai et al. | 219/121.43 |
| 4,854,263 | 8/1989 | Chang et al. | 118/715 |
| 5,314,541 | 5/1994 | Saito et al. | 118/725 |
| 5,374,594 | 12/1994 | van de Ven et al. | 438/758 |
| 5,377,425 | * 1/1995 | Kawakami et al. | 34/92 |
| 5,478,429 | 12/1995 | Komino et al. | 156/345 |
| 5,665,167 | 9/1997 | Deguchi et al. | 118/728 |
| 5,673,750 | 10/1997 | Tsubone et al. | 165/275 |

OTHER PUBLICATIONS

D.R. Wright et al., "Low temperature etch chuck: Modeling and experimental results of heat transfer and wafer temperature," J. Vac. Sci. Technol. A. 104(4), Jul./Aug. 1992, pp. 1065–1070.

* cited by examiner

*Primary Examiner*—Pamela Wilson
(74) *Attorney, Agent, or Firm*—Valerie G. Dugan

(57) ABSTRACT

An apparatus and method is provided for capturing, heating and degassing a wafer without using moving parts and without exposing the wafer to external stress. A degassing chamber is backfilled with a dry gas that improves wafer heating ramp rates and wafer heating uniformity. The backfilled gas efficiently conducts heat at relatively low pressures. Thus the degassing chamber may be evacuated via a cryo-pump without the need for an intermediate rough pumping step. Further, because the wafer is heated primarily by conduction, wafer temperatures are easily and precisely controlled independent of layers previously deposited on the wafer. Frontside heating elements such as heat generators and/or heat reflectors are provided that further improve wafer heating ramp rates and wafer heating uniformity by directing heat toward the front surface of the wafer. Preferably as heat radiates from the wafer it is reflected back to the wafer by a frontside reflector. The improved wafer heat uniformity provides more uniform desorption of contaminants which are then entrained by the dry gas and pumped from the degassing chamber. An isolation valve such as a slit valve provides a highly reliable and inexpensive means of isolating the cryo-pump from the degassing chamber.

12 Claims, 4 Drawing Sheets

DEGASSING METHOD AND APPARATUS

CROSS REFERENCE TO RELATED APPLICATIONS

The present application is related to commonly owned U.S. Pat. application Ser. No. 08/889,990 filed Jul. 10, 1997.

FIELD

The present invention relates generally to the field of semiconductor device fabrication, and specifically to degassing semiconductor wafers.

BACKGROUND

Semiconductor substrates and the layers deposited thereon (collectively referred to herein as a "wafers") absorb water vapor and other gases and impurities (e.g., hydrocarbons) when exposed to the same (e.g., when a wafer is removed from a vacuum chamber). These gases and impurities degrade film properties and therefore must be desorbed and driven off the wafer (i.e., the wafer must be degassed) before further films are deposited thereon.

One conventional degas module uses infrared radiation to heat the wafer to a desired temperature. The infrared radiation originates from an array of lamps positioned above the wafer. The wafer's temperature is measured using infrared pyrometry, a measure of the infrared radiation emitted from the wafer and, if the emissivity of the wafer is known, a measure of the wafer's absolute temperature. A major disadvantage of heating a wafer by infrared radiation and measuring its temperature by infrared pyrometry is the substantial transparency of most common substrate materials (e.g., silicon) to infrared wavelength radiation at the temperature range of interest for degassing (150–500° C.). Because most substrates are transparent to infrared wavelengths, the rate at which a wafer heats is dependent on the presence of other non-transparent (i.e., energy absorbing) layers, and device patterning placed on the wafer before it enters the degas chamber. Furthermore, any layers or device patterns which may be present from previous process steps affect the wafer's emmissivity making it difficult to obtain an accurate wafer temperature measurement by infrared pyrometry.

In order to achieve heating rates independent of wafer patterning some conventional degas methods employ a heated substrate support. However, due to surface roughness of both the wafer and the substrate support, small interstitial spaces may exist between the substrate support and the wafer which effectively decreases the contact area and heat transfer rate therebetween. Particularly in vacuum environments, this decreased contact area causes heat transfer to be dominated by radiation, and thereby to be slow, (as little radiation is produced at typical degassing temperatures). These spaces interfere with and cause non-uniform heat transfer from the substrate support to the wafer. To promote more uniform heat transfer, a heat transfer gas such as argon, helium or nitrogen is often used to fill the interstitial spaces between the wafer and the substrate support. This gas has better heat transfer characteristics than the vacuum it replaces and therefore acts as a thermal medium for heat transfer from the substrate support to the wafer. Accordingly the heat transfer coefficient of such a system is dependent on the spaces between the wafer and the substrate support and on the pressure, the atomic mass and the accommodation coefficient of the heat transfer medium. Small spaces and high pressures generate the best heat transfer.

In an effort to achieve smaller spaces, more efficient heating and more uniform wafer temperatures, conventional degassing apparatuses mechanically clamp the wafer to the substrate support using a clamp ring which contacts the outer edge of the wafer's frontside (i.e., a side that faces into the chamber). The clamp ring holds the wafer against the substrate support to maintain the necessary gas pressure between the substrate support and the wafer's backside (i.e., a side that faces the substrate support); a lower pressure is therefore maintained along the wafer's frontside than the pressure along the wafer's backside. However, the opposing forces applied to the wafer by the clamp ring and by the backside gas pressure may cause the wafer to bow. For example, a 10 Torr backside pressure causes an 8 inch wafer to bow about 1 mm at the wafer's center, and causes a 12 inch wafer to bow about 5 mm at the wafer's center. This bow increases the space between the substrate support and the wafer's backside, thereby decreasing the backside pressure and reducing heat transfer. Moreover, a 10 Torr backside pressure can cause the stress in the substrate to exceed the substrate's yield strength and break the wafer.

In addition to the disadvantages described above, mechanical clamping of the wafer is undesirable because the clamp ring consumes otherwise patternable surface area and because the surface contact between the wafer and the clamp ring promotes particle generation particularly as the wafer heats and expands. Accordingly, a need exists for a degassing apparatus and method that heats wafers independent of individual wafer patterning, that reduces wafer bowing, that reduces particles generated by contact between moving parts, and that increases patternable surface area.

SUMMARY OF THE INVENTION

The present invention provides a degassing apparatus and method for flowing gas into a degassing chamber until the degassing chamber reaches a pressure at which wafer heating occurs primarily via gas conduction rather than radiation. Thus, wafer heating and degassing occur uniformly regardless of pre-existing wafer patterning. Gas is preferably gradually flowed into the degassing chamber via a needle valve or flow controller so as to prevent the wafer from being unseated from the heated substrate support 15. Thus, the wafer need not be clamped. Because pressures as low as a few Torr provide adequate heat conduction (the heat conductivity of Argon, for example, gas varying from near zero at high vacuum levels to full conductivity at 4 Torr.), after a degassing process the degassing chamber may be evacuated via a cryo-pump, without the need for an additional rough pumping step. Thus the configuration of the present invention provides faster evacuation times and increased throughput as compared to conventional systems that require both rough and high vacuum pumping. A roughing pump may nonetheless be employed with the present system to increase the time between cryo-pump regenerations. Alternatively the cryo-pump can be replaced with both a roughing pump and a turbo molecular pump.

An isolation valve such as a slit valve provides reliable cost effective isolation between the degassing chamber and a cryo-pump. A plurality of pins may be placed under the wafer to facilitate gas flow to the wafer's backside. To further enhance wafer temperature heat-up rate and wafer temperature uniformity during the degassing process and to reduce wafer temperature drop during the chamber evacuation for wafer transfer, a frontside heating element (e.g., a heat source and/or heat reflector) is placed preferably parallel to the wafer's frontside and in sufficiently close proximity to reflect heat that radiates from the wafer back to the wafer. Thus wafer heating and degassing continues to occur even as the chamber is being pumped out for wafer transfer.

By reducing the number of particles (via elimination of the clamp ring), by reducing reabsorbed moisture (via frontside heating elements contained within the vacuum chamber), and by reducing wafer stress (via a uniform frontside/backside pressure) the present invention greatly improves the wafer degassing process. Accordingly with use of the present invention less contamination and stress induced failures occur, and product yields increase. Also, since heat-up rates and degassing rates are higher with the present invention than with conventional radiatively heated degassing systems, the throughput of the overall semiconductor fabrication system is increased. These and other objects, features and advantages of the present invention will become more fully apparent from the following detailed description of the preferred embodiments, the appended claims and the accompanying drawings.

DETAILED DESCRIPTION OF THE PREFERRED EMBODIMENTS

Figure 1A:
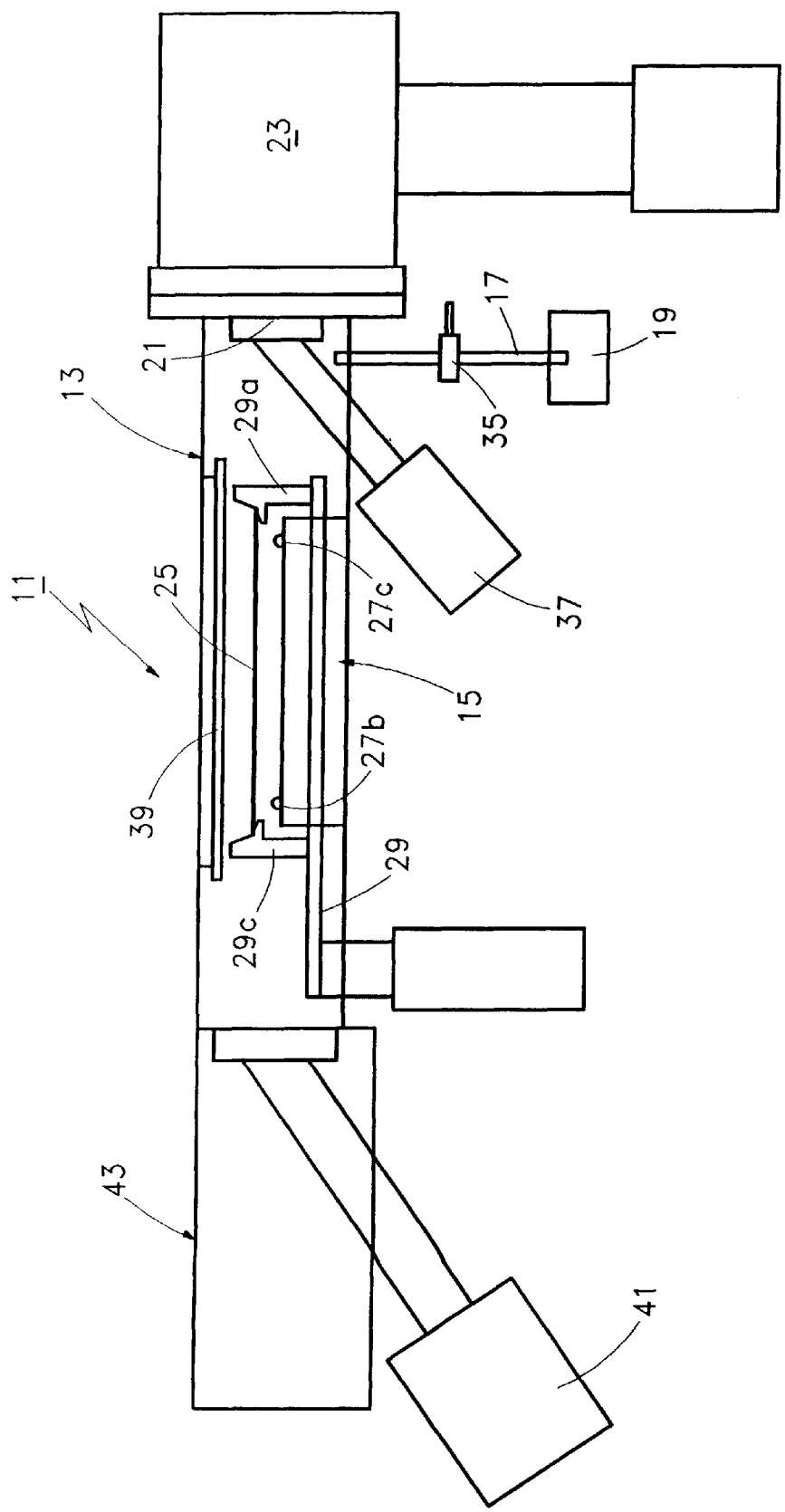
FIG. 1A is a side elevational view of a degassing apparatus made in accordance with the invention.
Figure 1B:
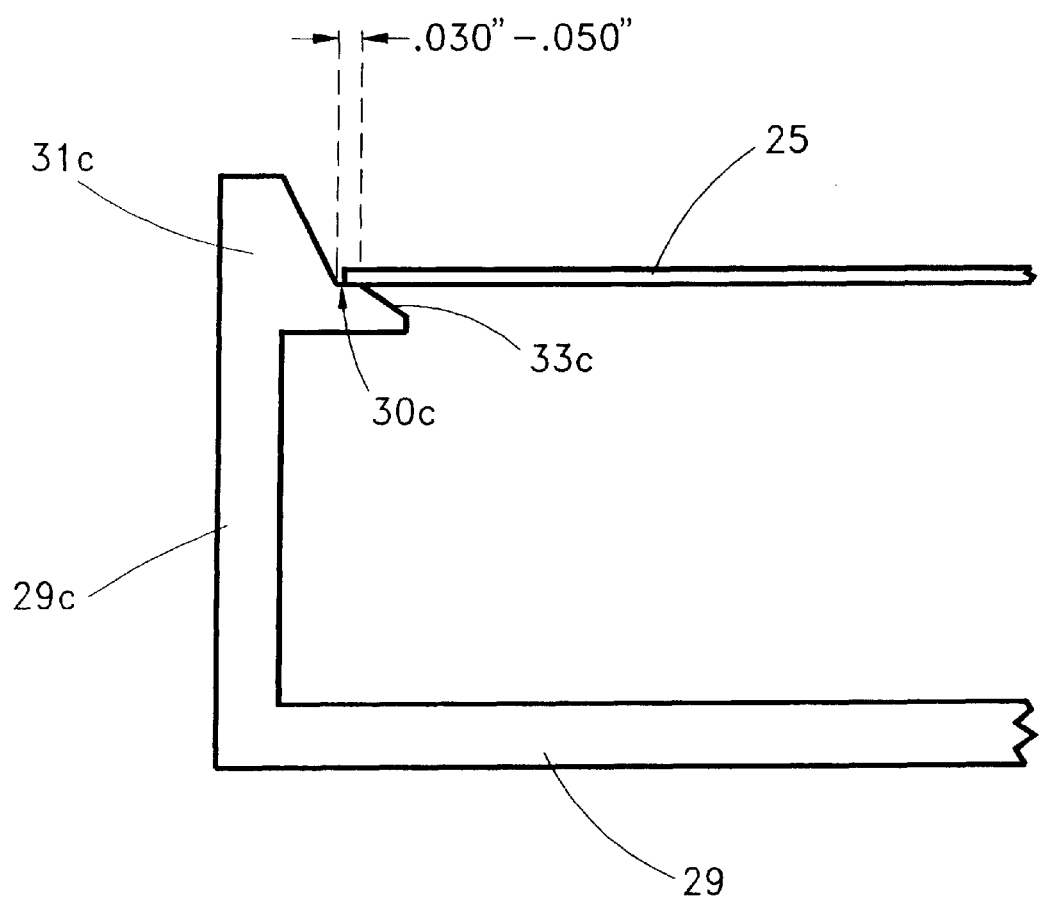
FIG. 1B is a partial side elevational view providing a closer view of the wafer lift hoop of the degassing apparatus of FIG. 1A.
Figure 2:
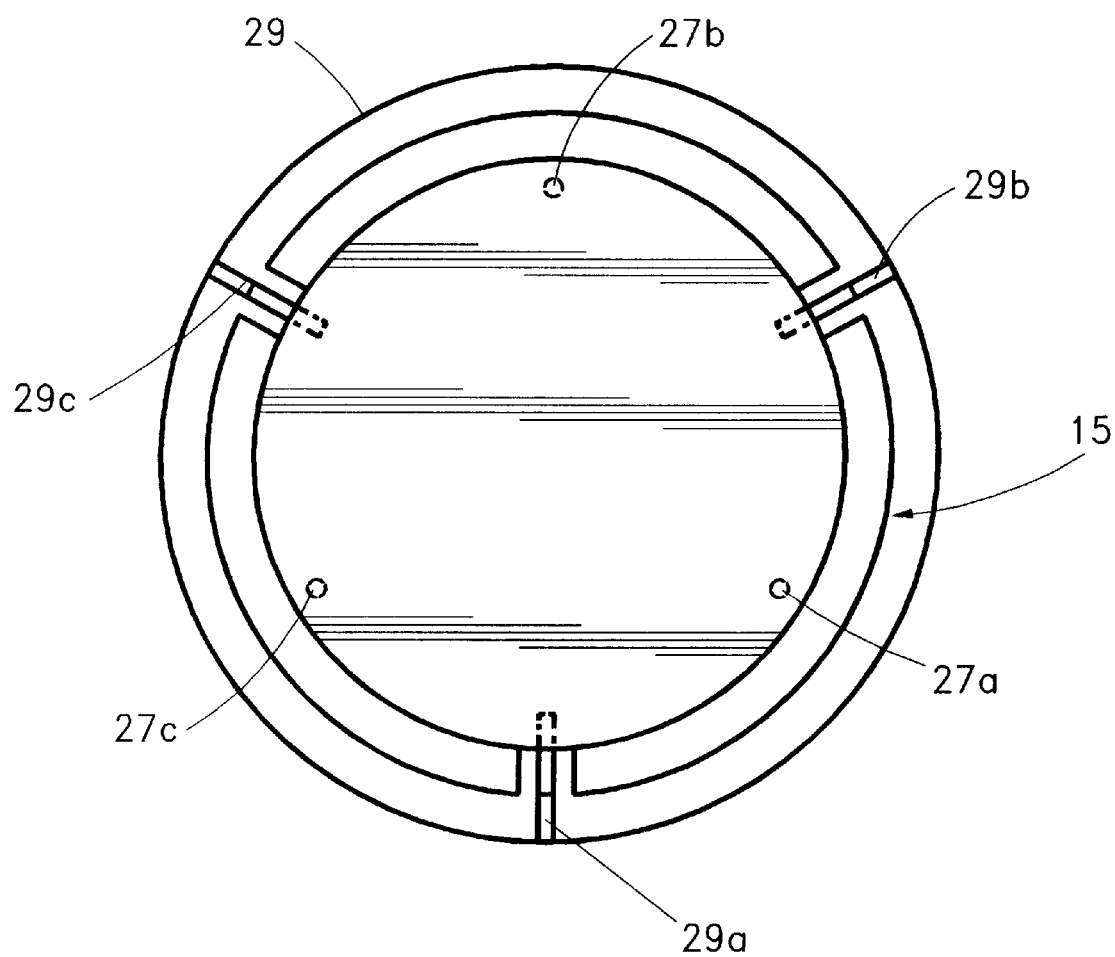
FIG. 2 is a top elevational view of the substrate support of the degassing apparatus of FIG. 1A.
Figure 3:
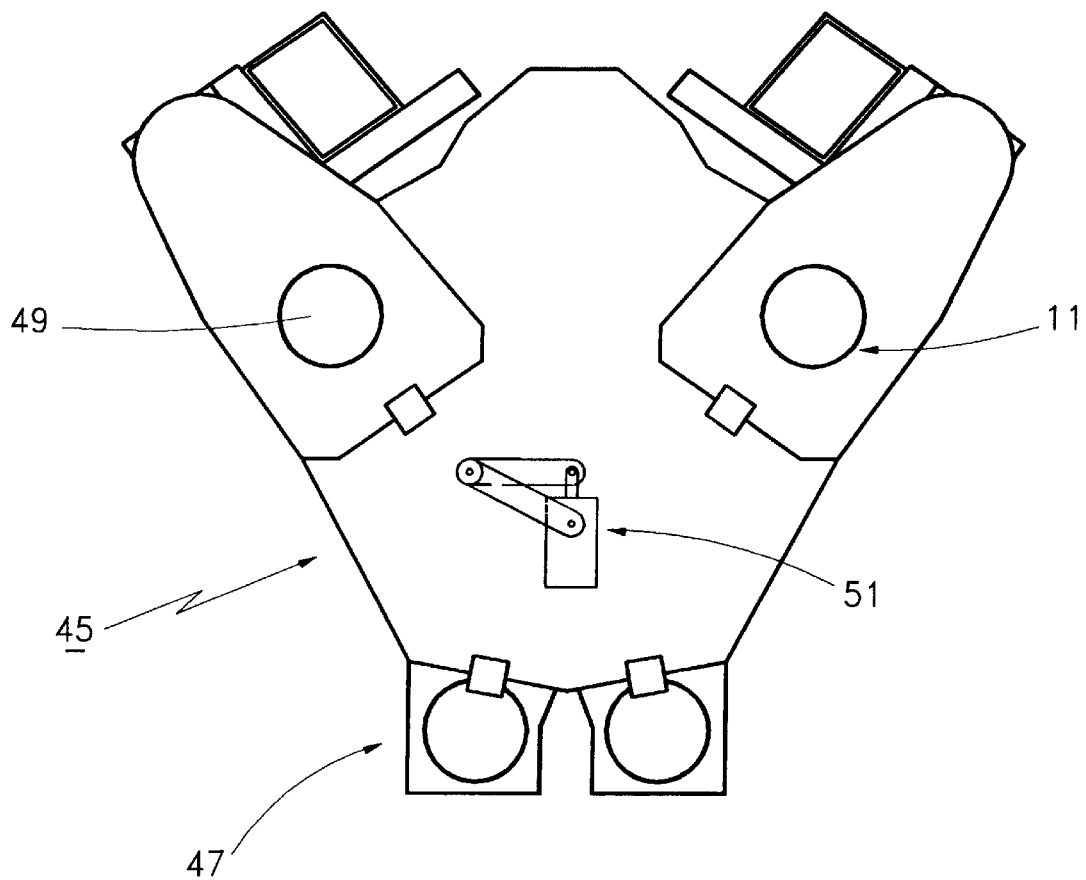
FIG. 3 is a top plan view of a fabrication tool that employs the inventive degassing apparatus of FIG. 1A.

For convenience the following table lists the reference numerals used in FIGS. 1–3 and the items identified thereby.

| REFERENCE NUMERAL | DESCRIPTION |
| --- | --- |
| 11 | degassing apparatus |
| 13 | vacuum chamber |
| 15 | substrate support |
| 17 | gas inlet |
| 19 | dry gas source |
| 21 | gas outlet |
| 23 | gas pump |
| 25 | wafer |
| 27a-c | pins |
| 29 | wafer lift hoop |
| 29a-c | fingers |
| 30 | wafer shelf portion |
| 31 | side portion |
| 33 | sloped lower portion |
| 35 | needle valve/flow controller |
| 37 | isolation valve |
| 39 | reflector |
| 41 | buffer chamber slit valve |
| 43 | buffer chamber |
| 45 | fabrication system |
| 47 | first load lock |
| 49 | process chamber |
| 51 | wafer handler |

FIG. 1A is a side elevational view of a degassing apparatus 11 configured in accordance with the invention. In order to conveniently describe the inventive apparatus 11 its components will be described with reference to the object to be degassed. However, it will be understood that the object itself is not a part of the apparatus.

As shown in FIG. 1A the degassing apparatus 11 comprises a vacuum chamber 13 containing a heated substrate support 15. A gas inlet 17 couples a dry gas source 19 (such as a noble gas or nitrogen with preferably less than 10 parts per billion of general contaminants, such as water, hydrogen, hydrocarbons, etc.) in fluid communication with the vacuum chamber 13. The gas emitted from the dry gas source 19 may be further "dried" via a getter or cold trap (not shown) within the gas inlet 17. A gas outlet 21 couples the vacuum chamber 13 in fluid communication with a gas pump 23.

A wafer 25 is shown mounted on the heated substrate support 15. Optionally, a plurality of pins 27 (preferably, three pins 27a–c as shown in FIG. 1A) may be positioned beneath the wafer 25 so as to facilitate gas flow along the backside of the wafer 25 and so as to reduce contact between the wafer 25 and the substrate support 15 (thereby reduce particles generated by such contact). Short pin heights facilitate heat transfer from the substrate support 15 to the wafer 25; preferrably the pins 27a–c are between 0.005–0.02 inches in height. The positioning of the plurality of pins 27 can be seen with reference to FIG. 2 which shows the heated substrate support 15 from a top plan view.

In order to easily place and extract a wafer from the heated substrate support 15, a conventional wafer lift hoop 29 (the operation of which is well known in the art) or the like is employed. The wafer lift hoop 29 preferably is of the type having three fingers 29a–c that extend under the wafer. Thus wafer contact is limited to the area above the three fingers 29a–c, and fewer particles are generated. More specifically the fingers 29a–c extend upwardly from the wafer lift hoop 29 and have a wafer shelf portion 30 preferably extending inwardly a horizontal distance of between 0.030–0.050 inches. Not only do the fingers 29a–c extend beneath the wafer 25 they also comprise a side portion 31a–c, respectively, (shown in FIG. 1B) which extends along the edge of the wafer 25. The side portion is preferably sloped sufficiently to avoid contact with the edge of the wafer 25 (avoiding particle generation thereby) as the wafer 25 is placed on or removed from the wafer handler (not shown). Similarly, to reduce contact between the wafer shelf portion 30 and the backside of the wafer 25, he fingers 29a–c have a sloped lower portion 33 which lopes away from the wafer shelf portion 30 at an angle greater than or equal to 10°. Thus, if the wafer 25 should slide off of the wafer shelf portion 30, the wafer 25 will be supported by the sloped lower portion 33, and thus will avoid a potentially catastrophic fall. Thus, even after the wafer lift hoop 29 has lowered (and the horizontal portion of the fingers 29a–c are housed in appropriately located recesses in the surface of the substrate support 15, the side portions 30a–c of the fingers 29a–c capture the wafer, preventing the wafer from moving out of center, or becoming unseated from the substrate support 15.

The rate of the gas flowing into the vacuum chamber 13 is preferably controlled via a needle valve or flow controller 35 operatively coupled along the gas inlet 17. Preferably, the gas pump 23 comprises a cryo-pump and the gas outlet 21 comprises an isolation valve 37, such as slit valve or a gate valve, operatively coupled to the gas pump 23 to control the gas flow rate from the vacuum chamber 13. A reflector 39 is positioned in close proximity above the wafer's 25 frontside such that heat radiating from the wafer 25 will reach the reflector 39 and be reflected back to the wafer 25. As an alternative to the reflector 39, a heater may be placed in close proximity above the wafer's 25 frontside such that heat radiating from the heater will each the wafer 25. Preferably such a heater would comprise reflective metal and would be positioned in close roximity to the wafer 25 such that heat radiating from the wafer 25 will reach the heater and be reflected back to the wafer 25. In this manner the wafer heat-up rate and the wafer temperature uniformity are greatly enhanced. Also, the cooling rate of the wafer 25 is significantly reduced, allowing the wafer to maintain a higher temperature as the vacuum chamber 13 is pumped out and as a buffer chamber wafer handler (not shown) reaches into the vacuum chamber 13 to extract the wafer 25 therefrom. The higher the temperature of the wafer 25 the less contaminants will reabsorb thereon.

As shown in FIG. 1A, the gas inlet 17 is positioned adjacent the heated substrate support 15. However, the gas inlet 17 could alternatively be coupled opposite the heated substrate support 15 and could comprise a manifold having a plurality of openings which diffuse gas emitted from the gas inlet 17 into the vacuum chamber 13 and cause a substantially uniform flow of dry gas over the wafer's 25 frontside. The design of such a manifold is well known to those of ordinary skill in the art of CVD reactor design. U.S. Pat. No. 4,854,263 entitled "Inlet Manifold and Method for Increasing Gas Dissociation and for PECVD of Dielectric Films" is incorporated herein for it teaching of a specific inlet manifold. When such a manifold is employed, the reflector 39 can be coupled to the manifold.

In operation, prior to placing a wafer 25 within the vacuum chamber 13, an isolation valve 37 is opened and an ion gauge (not shown) is turned on to monitor the pressure within the vacuum chamber 13. Thereafter, a buffer chamber slit valve 41 that operatively couples the vacuum chamber 13 to a buffer chamber 43 opens and a buffer chamber wafer handler (not shown) extends therethrough, carrying the wafer 25 into position above the heated substrate support 15. The wafer lift hoop 29 (via the three fingers 29a–c) lifts the wafer 25 from the buffer chamber wafer handler and lowers it onto the heated substrate support 15 after the buffer chamber wafer handler has sufficiently retracted. The isolation valve 37 is then shut and the ion gauge is turned off.

Thereafter the needle valve or flow controller 35 is turned on and a dry gas is flowed from the dry gas source 19 into the vacuum chamber 13 via the gas inlet 17. The dry gas is flowed into the vacuum chamber 13 until the pressure within the vacuum chamber 13 reaches a set point (e.g., 3–10 Torr). Any conventional pressure measurement device may be employed to monitor the pressure within the vacuum chamber 13. (It takes approximately 5 seconds to create a 10 Torr pressure within an evacuated 15 liter vacuum chamber with a dry gas (e.g., argon) flow rate of 2 s.l.m.)

After the vacuum chamber 13 reaches the pressure set point the needle valve or flow controller 35 is closed, shutting off the flow of dry gas to the vacuum chamber 13. The gas pressure within the vacuum chamber 13 aids the transfer of heat from the heated substrate support 13 to the wafer 25. As the wafer 25 heats, moisture and other contaminants are desorbed therefrom and mixed with the dry gas. Heat radiates from the wafer 25 to the reflector 39 and is reflected back to the wafer 25; in this manner the wafer 25 heats more efficiently. After only approximately 5–30 seconds the wafer 25 will reach the desired degassing temperature. Thereafter the isolation valve 37 is opened to begin evacuation of the vacuum chamber 13, and the ion gauge (not shown) is turned on to monitor the pressure within the vacuum chamber 13. As the vacuum chamber 13 evacuates, the dry gas and desorbed contaminants are carried away. Meanwhile the heat that radiates from the wafer 25 is reflected back to the wafer 25 by the reflector 39 so the wafer 25 maintains a high temperature and continues to desorb contaminants.

After the pressure within the vacuum chamber 13 is reduced to $1 \times 10^{-5}$ Torr or less, the wafer lift hoop 29 elevates, and the three fingers 29a–c thereof raise the wafer 25 above the heated substrate support 15, the buffer chamber slit valve 41 opens, the wafer handler (not shown) reaches into the vacuum chamber 13, extends under the wafer 25, the wafer lift hoop 29 lowers (transferring the wafer 25 to the wafer handler) and the wafer handler retracts carrying the wafer 25 into the buffer chamber 43. The wafer 25 continues to absorb heat reflected back from the reflector 39 until the wafer handler begins to retract. Even as the wafer handler retracts the wafer 25 maintains a sufficient temperature to degas contaminants and to prevent contaminant reabsorption. After the wafer handler retracts from the vacuum chamber 13 the isolation valve 37 closes. The wafer 25 is then transferred to a process chamber (not shown) for further processing.

FIG. 3 is a top plan view of a fabrication system 45 that employs the inventive degassing apparatus of FIGS. 1A and 1B. The fabrication system 45 comprises at least a first load lock 47, at least one process chamber 49, at least one wafer handler 51 and the inventive degassing apparatus 11.

In operation, a wafer carrier containing at least one wafer is loaded into the first load lock 47, and the first load lock 47 is pumped to the desired vacuum level. The wafer handler 51 extracts a first wafer and transports it to the inventive degassing apparatus 11. A sealable port such as the slit valve 37 (FIG. 1A) on the vacuum chamber 13 opens allowing the wafer handler 51 to reach into the vacuum chamber 13 and deposit the first wafer on the heated substrate support 15. The wafer handler 51 retracts and the slit valve 37 closes. The wafer is then degassed in accordance with the invention as described with reference to FIGS. 1A, 1B and 2. After degassing within the inventive degassing apparatus 11 is complete and the vacuum chamber 13 is evacuated as previously described, the slit valve 37 opens and the wafer handler 51 extracts the first wafer and carries it to the process chamber 49 for further processing. The process chamber 49 preferably performs chemical or physical vapor deposition or argon ion etching, as these processes will be more successful on a thoroughly degassed wafer. After the first wafer is processed within the process chamber 49 it is returned to the first load lock 47. The sequence repeats until each wafer within the wafer carrier has been processed and returned to the first load lock 47.

The foregoing description discloses only the preferred embodiments of the invention, modifications of the above disclosed apparatus and method which fall within the scope of the invention will be readily apparent to those of ordinary skill in the art. For instance, although the components of the inventive degassing apparatus and the configuration described herein are presently preferred, numerous variations may occur and yet remain within the scope of the invention. For instance, physical or chemical stimulation (e.g., radiation sources within the manifold and/or reactive gases such as $0_3$ or CO within the gas flux) may be used to further enhance wafer degassing. The needle valve or flow controller and the isolation valve can be manually adjusted but are preferably computer controlled. The inventive degassing apparatus is not limited to processes which mount the object to be degassed on the lower portion of the chamber; the invention applies equally to top or side wall wafer mounting. Appropriate alteration of the process so as to prevent the wafer from falling from the heated substrate support 15 will be readily apparent to those of ordinary skill in the art. Further, numerous objects other than wafers (for example liquid crystal display panels and glass plates) may benefit from the inventive process.

Accordingly, while the present invention has been disclosed in connection with the preferred embodiments thereof, it should be understood that other embodiments may fall within the spirit and scope of the invention, as defined by the following claims.

What is claimed is:

1. A degassing apparatus comprising:

a vacuum chamber;

a substrate support within said vacuum chamber for supporting an object to be degassed;

a dry gas supply inlet operatively coupled to said vacuum chamber for supplying a dry gas to said vacuum chamber; and a frontside heating element within said vacuum chamber for heating the frontside of the object.

2. The apparatus of claim 1 further comprising a cryo-pump operatively coupled to said vacuum chamber for pumping the dry gas from said vacuum chamber so as to degas the object.

3. The apparatus of claim 2 wherein said cryo-pump is operatively connected to said vacuum chamber via an isolation valve.

4. The apparatus of claim 3 wherein said isolation valve comprises a slit valve.

5. The apparatus of claim 4 wherein said frontside heating element comprises a reflector.

6. The apparatus of claim 4 wherein said frontside heating element comprises a heat source.

7. The apparatus of claim 4 wherein said frontside heating element comprises a heat source and a reflector.

8. The apparatus of claim 1 further comprising a wafer lifting mechanism operatively coupled to the substrate support, the wafer lifting mechanism having a portion that extends along the edge of the wafer so as to maintain the wafer in a desired position.

9. A method of degassing an object comprising:

placing the object within a vacuum chamber;

applying backside heat to the object;

applying heat to the frontside of the object from a position within the vacuum chamber;

supplying a dry gas flux to the vacuum chamber; and pumping the vacuum chamber to remove the dry gas flux and any contaminants desorbed from the object.

10. The method of claim 9 wherein applying heat to the frontside of the object comprises reflecting heat radiating from the object back to the object.

11. The method of claim 10 wherein applying heat to the frontside of the object further comprises generating heat.

12. The method of claim 9 wherein placing the wafer within the chamber comprises placing the wafer between portions of a wafer lifting mechanism that extend along the edge of the wafer.

* * * * *